United States Patent [19]

Gilker et al.

[11] Patent Number: 4,847,780
[45] Date of Patent: Jul. 11, 1989

[54] CURRENT MEASURING APPARATUS

[75] Inventors: Clyde Gilker, Milwaukee; Michael P. Dunk, Racine; Thomas G. Dolnik, Kenosha; Ross S. Daharsh, S. Milwaukee; Mark A. Berezinski, Cudahy, all of Wis.

[73] Assignee: Tennessee Valley Public Power Association, Chattanooga, Tenn.

[21] Appl. No.: 87,703

[22] Filed: Aug. 21, 1987

[51] Int. Cl.[4] .................... G06F 15/56; G01R 19/00
[52] U.S. Cl. .................................... 364/483; 324/127; 340/870.17; 364/492
[58] Field of Search ............... 364/483, 492, 571; 324/17, 127, 133; 340/538, 539, 657, 870.17, 870.38; 323/223, 301, 907

[56] References Cited

U.S. PATENT DOCUMENTS

| | | | |
|---|---|---|---|
| 3,453,544 | 7/1969 | Schweitzer, Jr. | 324/127 |
| 3,984,798 | 10/1976 | Bussen | 324/127 |
| 4,384,289 | 5/1983 | Stillwell et al. | 340/870.17 |
| 4,420,752 | 12/1983 | Davis et al. | 340/870.17 |
| 4,589,075 | 5/1986 | Buennagel | 364/492 |
| 4,625,283 | 11/1986 | Hurley | 364/483 |
| 4,630,218 | 12/1986 | Hurley | 364/483 |
| 4,635,055 | 1/1987 | Fernandes et al. | 340/870.17 |
| 4,689,752 | 8/1987 | Fernandes et al. | 364/492 |
| 4,709,339 | 11/1987 | Fernandes | 340/870.17 |
| 4,717,889 | 1/1988 | Engelmann | 323/301 |
| 4,728,887 | 3/1988 | Davis | 340/870.17 |

Primary Examiner—Parshotam S. Lall
Assistant Examiner—Kevin J. Teska
Attorney, Agent, or Firm—Haight & Hofeldt

[57] ABSTRACT

Apparatus is disclosed for monitoring an A.C. distribution line comprising a novel split transformer core which may be inserted remotely about a distribution feeder line without de-energizing of that line, an encoder for producing a train of voltage signals whose duration are characteristic of the magnitude of the A.C. current flowing through the line and for producing a train of light pulses from the voltage levels which characterize the magnitude of the A.C. current flowing through the line, a decoder which is opticlaly linked to the encoder for measuring the time intervals of the light pulses and for converting the time intervals into a numerical value representing the current flowing through the line.

46 Claims, 9 Drawing Sheets

FIG. 5
CURRENT ENCODER AND TRANSMITTER

| A | B | OUT |
|---|---|---|
| 0 | 0 | 0 |
| 0 | 1 | 1 |
| 1 | 0 | 1 |
| 1 | 1 | 0 |

CURRENT MEASURING APPARATUS

TECHNICAL FIELD

This invention relates to current measuring devices in general and, more particularly, to an apparatus for monitoring the current flowing through a distribution line feeder using a split core current transformer and a fiber optic link.

BACKGROUND OF THE INVENTION

Heretofore, various circuits have been proposed for the measuring current flowing in an A.C. distribution line.

Perhaps, the simplest current sensing apparatus is a current transformer. Such a transformer has at least one turn of a line conductor forming the primary winding or the input, a multi-turn secondary winding which develops a current directly related to the line current and a iron core to magnetically link the primary and secondary windings. The device is simple, although it does have some disadvantages. For example, there exists the possibility that the iron core may exhibit residual magnetism after the occurrence of high fault current. A more fundamental disadvantage is that such a transformer cannot be safely used because the output leads of the secondary winding are normally used at ground potential and the primary winding is normally the high voltage line conductor. To be safely used, expensive and bulky electrical insulation must be used to separate the current transforming high voltage primary winding from the ground potential used secondary winding.

U.S. Pat. No. 4,384,289 discloses a device for measuring current on live transmission lines. That device utilizes a toroidal shaped transponder which includes a hub and concentric spoke mounting arrangement that is connected to an energized power transmission line by means of a spring-loaded hinge mechanism. It includes a radio frequency transmission circuit and an antenna so that the current line can be monitored remotely.

U.S. Pat. No. 4,471,355 provides an apparatus for sensing and producing an amplitude and phase replica of an alternating current signal using a toroidal coil and a fiber optic transmission line. Unfortunately, it requires the use of a bulky and complex power supply which is capacitively connected to the high voltage conductor and it fails to provide a convenient and directly usable source of digital signals.

U.S. Pat. No. 4,630,218 also uses a fiber optic cable and a current measuring apparatus. It uses a current sensing and pulse transmitting apparatus that is directly powered from a current transformer. It is basically a non-linear device in the the CT drives a resistor until one zener diode conducts and then on the next half-cycle another zener diode operates at a different voltage.

A more complicated current measuring apparatus is disclosed in U.S. Pat. No. 4,642,564. This patent describes a device which may be used to monitor a three-phase distribution system. No teaching is provided with regard to digital encoding and decoding for use by a microprocessor.

Finally, there is the apparatus taught by U.S. Pat. No. 4,625,283. That device makes use of a current transformer and an electronic circuit which senses the crossing of a negative reference voltage and a positive reference voltage of the same magnitude. Unfortunately, there is no teaching with regard to electrical isolation and the use of the device in a field environment. More importantly, it, like the device of the '218 patent, does not have high resolution when high currents are encountered.

Thus, while the art recognizes the benefits of electrical isolation between the line monitored and the monitoring apparatus, the use of a current transformer to provide a current replica of the line to be monitored, the use of microprocessors and associated electronics to provide a computation of the line current based on pulsed information, it has failed to provide an apparatus which can be used utility personnel to monitor the line current at a distribution feeder line. More importantly, the art does not teach an apparatus which can be quickly installed by field personnel without requiring deenergization of the monitored line, or direct electrical contact with the monitored line, and an apparatus which has high resolution when high currents are measured. Clearly, despite the number of recent developments in the art, there remains room for improvement.

SUMMARY OF THE INVENTION

In accordance with the present invention, there is disclosed an apparatus for monitoring an A.C. distribution line comprising, in one embodiment: a current transformer that is adapted to be removably clamped about and electrically insulated from the distribution line; and an electronic encoder for producing a train of voltage signals whose duration are characteristic of the magnitude of the A.C. current flowing through the line, and for producing a train of light pulses from the voltage signals which characterize the magnitude of the A.A. current flowing through the line.

In one preferred embodiment, a decoder is provided which is spaced apart and electrically isolated from the encoder by means of fiber optic cable. The decoder measures the time intervals between the light pulses and converts the train of light pulses into a numeric value representing the current flowing through the line. There is no need to reconstruct the line current have shape as in the case of some prior art methods.

Preferably, the current transformer comprises: a split transformer core; means for transforming the current flowing through the distribution line; means for connecting together the two split core parts, such that one of the core parts is free to move relative to the other part between a closed position and a open position wherein the core parts are free to pass around the distribution line; and means for moving the two core parts between their open and closed positions and which is operable at a spaced distanced from the distribution line.

In one specific embodiment, the apparatus comprises: a current transformer; means powered by the transformer for producing a D.C. voltage level; means operating in response to the current transformer for producing a D.C. voltage level; first half-cycle means for producing a first voltage which is proportional to the line current flowing during one half of the period of the A.C. current; second half-cycle means for producing a second voltage which is proportional to the current flowing during the remaining half of the period of the A.C. current; means for producing at least four levels of D.C. voltage; means for sequentially comparing said four levels of voltage against said first and second voltages and for producing a train of voltage signals characteristics of the magnitude of the current flowing through the line; a pulse forming network; a flip-flop driven by the pulse forming network; and a microprocessor which has been programed with an interrupt which is gated by the output of the flip-flop and which counts the number of transitions of the flip-flop, determines the time intervals between the transitions and calculates the RMS value of the current flowing through the distribution line.

In another specific embodiment, the apparatus comprises a current transformer, a zero crossing detector powered by the current transformer, an A.C. to D.C. converter for producing a voltage level which is proportional to the current flowing through the A.C. distribution line, means for producing a constant current to charge a capacitor, and signaling means which operates in response to the zero crossing detector to turn on a light source at the beginning of the A.C. current wave form and shuts off the light source when the voltage level is generally equal to the threshold voltage, whereby the duration that the light source was on is a characteristic of the magnitude of the A.C. current flowing through the line.

From the foregoing, it will be appreciated that the split core current transformers, the fiber optic cable link, and the provision for at leat four levels of comparison or for a constant current source to provide a threshold voltage for comparison, offers the user of the apparatus better resolution, improved safety, and greater utility then what has been heretofore available to the industry. Numerous other advantages and features of the present invention will become readily apparent from the following detailed description of the invention and the embodiments thereof, from the claims and from the accompanying drawings.

BRIEF DESCRIPTION OF THE DRAWINGS

FIG's. 2 and 2A illustrate one embodiment of the current transformer as the subject of the present invention;

FIG. 3 is another embodiment of the current transformer that is the subject of the invention;

FIG's. 4 and 4A illustrate the operation of a tool which can be used to install the current transformer of FIG's. 2 and 3 about the distribution line feeder of FIG's. 1 and 1A;

FIG. 13A is a partial schematic drawing of one portion of the circuit shown in FIG. 13; and FIG's. 14A, 14B, and 14C are graphs of two alternating current wave forms and the voltage signals which are characteristic of them and which are produced using the apparatus of FIG. 13.

DETAILED DESCRIPTION

While this invention has an acceptable embodiment in many different forms, there are shown in the drawings and will herein be described in detail several preferred embodiments of the invention. It should be understood, however, that the present disclosure is to be considered an exemplification of the principles of the invention and is not intended to limit the invention to the specific embodiments illustrated.

Before describing the detailed aspects of the invention, one very practical use of the invention will be described. Once the utility of the invention is understood, individual components will be described in greater detail.

Data Base Recorder

Figure 1:
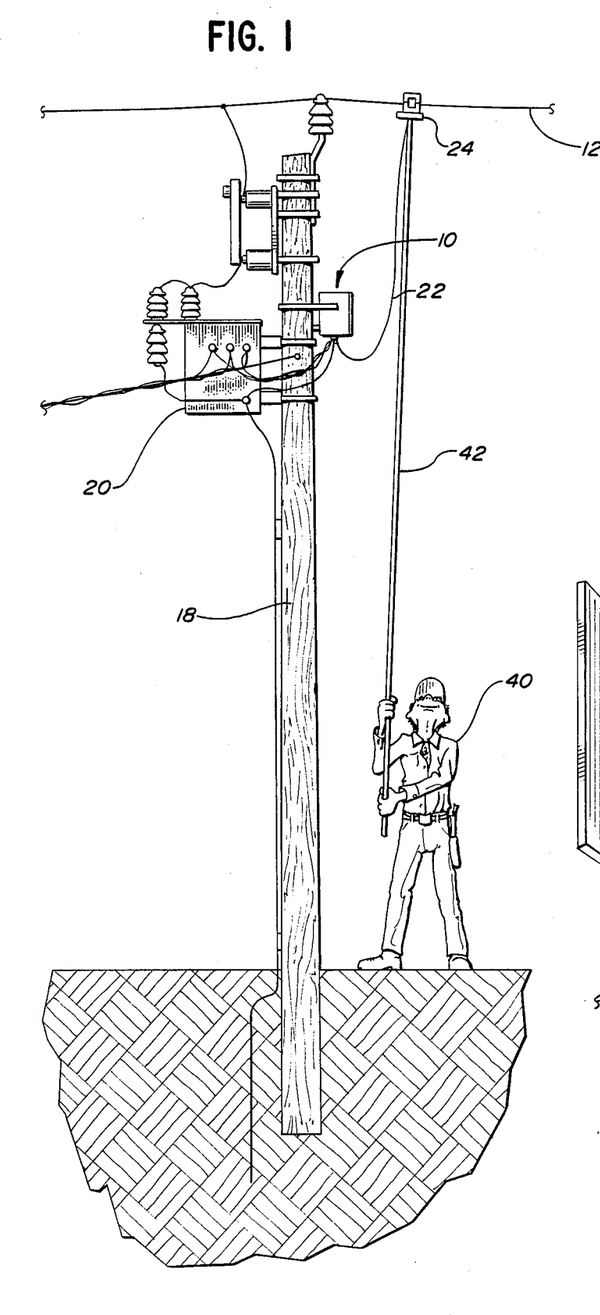
FIG. 1 is a pictorial representation of one application of the invention that is covered by this patent.

Turning to FIG. 1, there is illustrated a Data Base Recorder (DBR) 10 which is used to monitor a three-phase electrical distribution feeder 12. For purpose of simplicity, only one phase is depicted. For three phase monitoring, three assemblies of the split core current transformer would be used, each coupled to one DBR. The DBR comprises an enclosure 14 with a removable printed circuit board 16 that contains electrically erasable non-volatile memory (i.e., EEPROM) for long term monitoring of the feeder. The enclosure 14 can be mounted on a utility pole 18 or installed at a substation. One or three phase voltages, derived from a distribution transformer 20, are connected to the DBR along with a current input signal from one or three split core Current Transformers, each of which is isolated from the enclosure 14 by a fiber optic cable of link 22. The DBR is also provided with a temperature sensor 26. Once placed into operation, the various electrical line parameters are sampled, converted to a transmittable form, transmitted, recovered and stored in a time averaged form. Along with temperature, they are converted to a form suitable for digital storage and saved at user's selectable time intervals in memory. By using a battery powered clockcalendar, power outages can be detected and stored. At the end of the recording period, the circuit board assembly 16 can be removed and taken to a central location for analysis using a special purpose computer or a PC. Preferably, the PC is provided with menu-selectable software that controls the transfer of stored information to a diskette. This feature permits the erasure and reuse of a circiut board assembly 16. The data, when converted from a stored form, may then be used by the PC for display on a monitor or sent to a printer for further study. Preferably, the PC is provided with software to calculate such parameters as voltage, current, phase angle, time and temperature. When so calculated, KW, KVA, KVR, KW hours, percent thermal load, and other useful values can be determined (including maximum and minimum values). The information so obtained can be used to determine line loading for utility planning or for selecting the location of capacitor banks, used to determine switching criteria, or used to characterize problem load locations.

CURRENT TRANSFORMER

Figures 2, 2A:
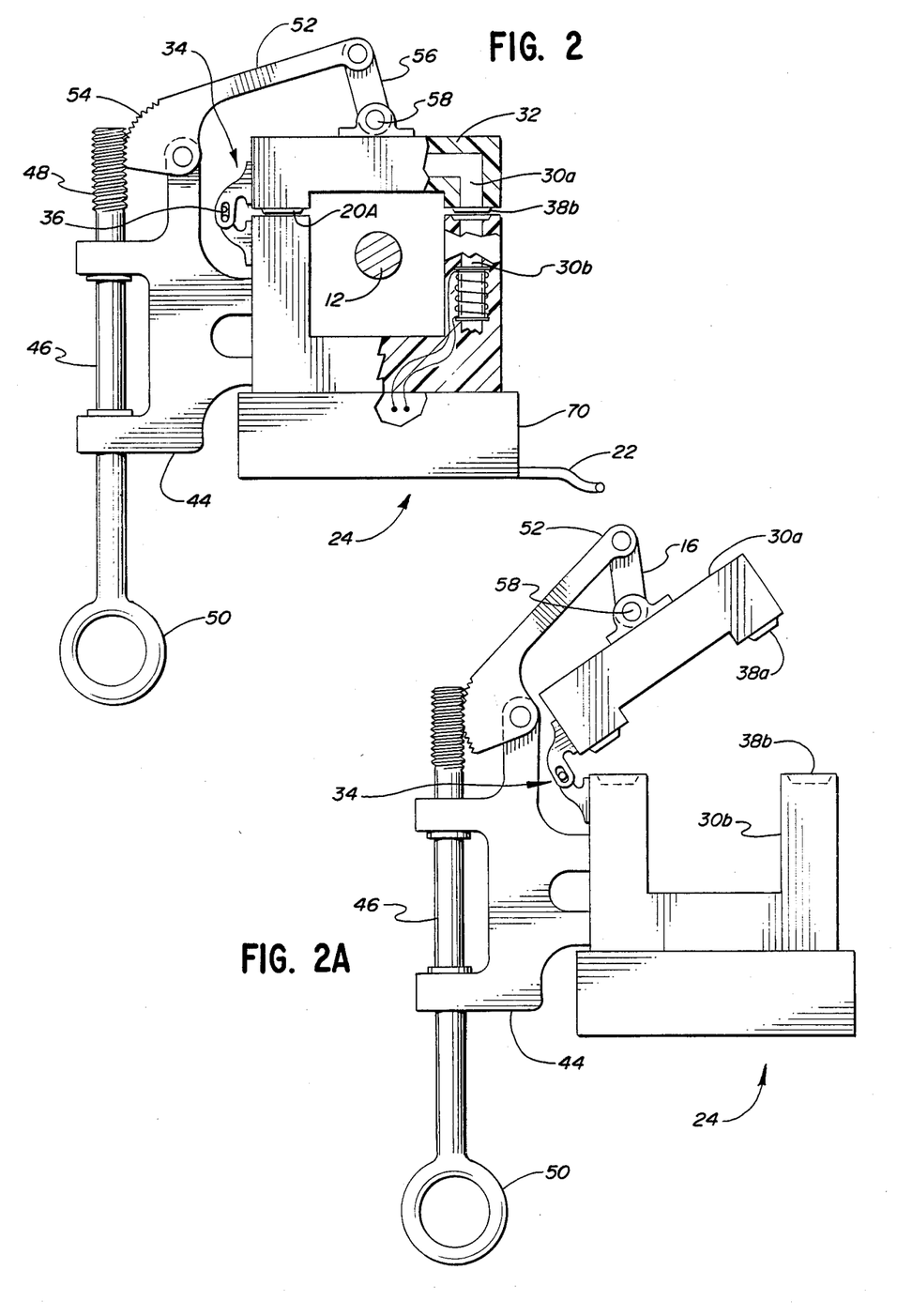

Turning to FIG. 2, there is shown one embodiment of the current transformer 24, that is the subject of the present invention. Specifically, the current transformer 24 comprises a split transformer core 30a and 30b adapted to encompass a distribution line or feeder 13 conducting A.C. electricity. Each of the core parts are preferably encapsuled in an empoxy electrical insulating material 32. The two core parts are connected together by a hinge 34. Preferably, this hinge is of the piano-type, in that it will keep the two parts from moving out of alignment with each other. The hinge 34 is provided with an vertical slot 36 to permit limited vertical freedom between the two core parts while permitting the two core parts 30a and 30b to close snugly together. To further assure proper alignment of the two core parts in closing, the abutting ends of each part are chamfered/recessed so as to form two interlocking abutting surfaces 38a and 38b.

Those skilled in the art will appreciate the fact that the placement of a split core CT on the electrical distribution line is a relatively difficult task (See FIG. 1), for no other reason than the fact the human operator or electrical utility person 40 cannot observe the mating of the two core parts. The utility personor lineman is ordinarily located at the bottom of the utility pole 18 and uses a "hook-stick" 42, or other tool (i.e., a "shot gun" stick) (See FIG. 4), to place the CT on the distribution line 12.

One of the core parts 30b is connected to a stationary bracket or frame 44. Attached to the frame is a drive shaft 46. The drive shaft is threaded at one end 48 and is provided with a ring 50 at the other end. The threaded end is used to drive a swing arm 52. The swing arm 52 is pivotally connected to the frame 44 and is provided with a complimentary threaded section at one end 54 and a pivoted link 56 at the opposite end. The link 56 is connected to the other core part 30a and to the threaded end 54 of the swing arm 52 so as to engage the drive shaft 46. Thus, by twisting the ring 50, the drive shaft 46 is rotated and the swing arm 52 moves the two core parts 30a and 30b towards and away from each other. Preferably, the link 56 is pivotally connected at the center 58 of the associated core part 30a so as to provide a balanced application of force against both ends of each core part when the core parts are closed together. This produces a minimum total air gap between the core parts and assures a snug fit.

Figures 3, 4, 4A:
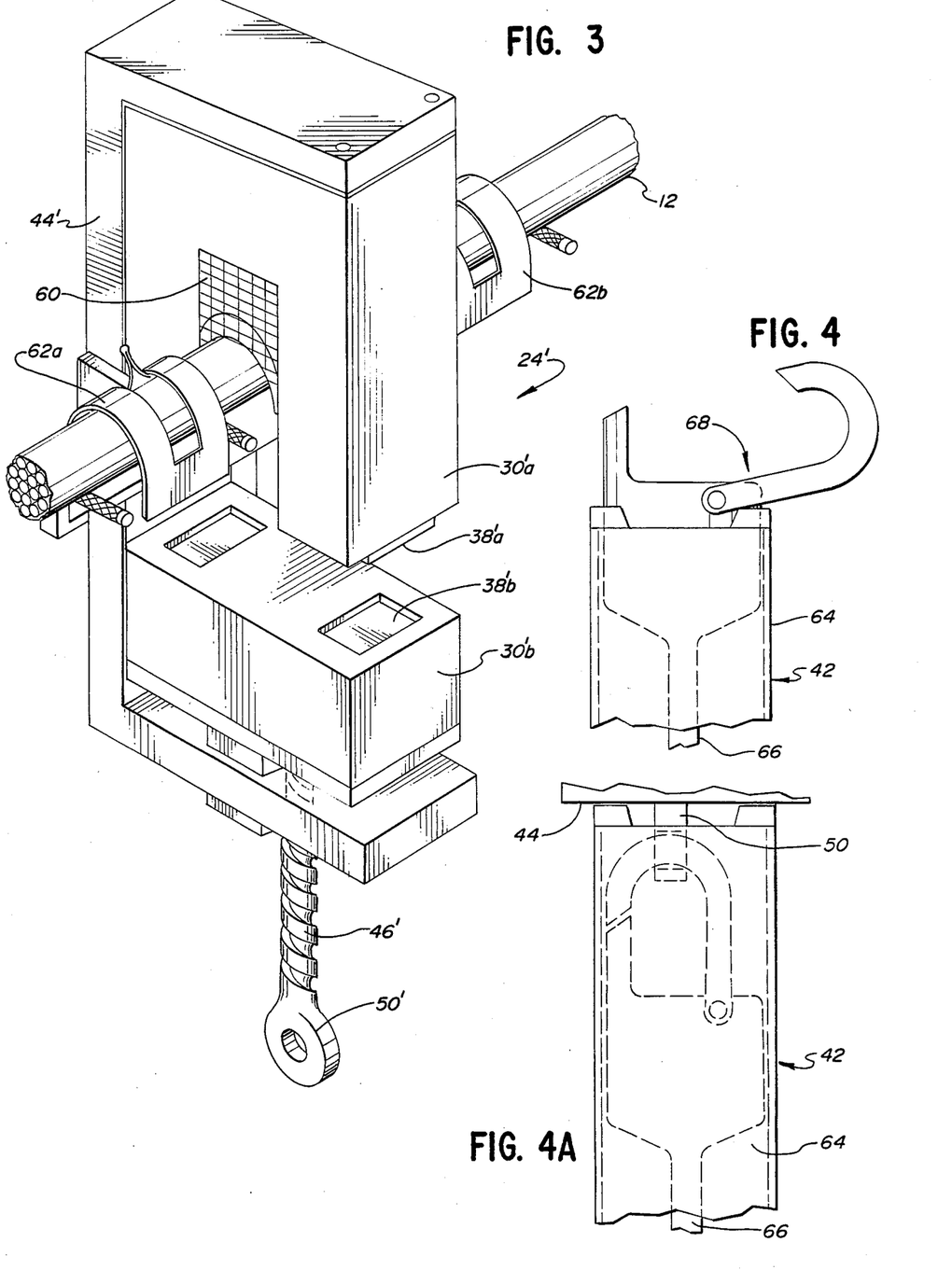

Turning to FIG. 3, there is shown another embodiment of the current transformer CT that is a subject of this patent application. There the current transformer 24' comprises two core parts 39'a and 30'b which are mounted on a frame 44', such that one core part is free to translate toward the other core part through the action of a lead screw 46'. Once special feature of this embodiment is that it is provided with a means to hold captive the conductor 12 in the "window" of the CT. This captive means 60 can be a "rubber" filler (i.e., a rubber foam filler material) disposed within the window of the CT that deforms around the conductor 12 as the two core parts 30'a and 30'b are forced together around the conductor. Clips 62a and 62b can also be provided to hold the CT in place and to keep it from sliding along or rotating about the conductor 12. As in the previous embodiment, the two ends of the two core parts are provided with means 38'a and 38'b for aligning to two core parts so as to minimize any air gaps. As before, the lead screw 46' is provided with a hook or ring 50' at one end so that it can be operated by a shotgun stick (see FIG's. 4 and 4A) or similar tool.

FIG's. 4 and 4A depict the tool, a "shotgun stick" 42 that may be used to place the CT of FIG's. 2 and 3 on the feeder line 12 of FIG. 1. The tool 42 comprises an outer insulated tube 64 and an inner hooked rod 66. One end of the rod 66 is provided with a pivoted hook 68. The pivoted hook 58 is closed (FIG. 4A) when it is drawn into the tube 64 and opens by a bias spring when the rod 66 is pushed out of the tube (See FIG. 4). Thus, when the CT is to be placed in position, one would insert the hook 68 in the eyelet of ring 50 and draw the rod 66 into the tube 64. The ring 50 would be drawn into the tube 64 until the frame 44 of the CT rested atop the tube. By keeping the CT snugly atop the tube 64, the tool can be manipulated to snare the feeder line 12 within the window of the CT. Then by twisting the inner rod 66, the CT would be clamped about the feeder line 12. Once the CT is fixed in place, the hooked end of the tool can be pushed out of the tube and the tool withdrawn from the frame (See FIG. 4A). This will allow the hook 68 to separate from the ring 50 of the CT. To remove the CT, the above described process would be reversed.

Electronic Circuitry (First Embodiment)

Figure 5:
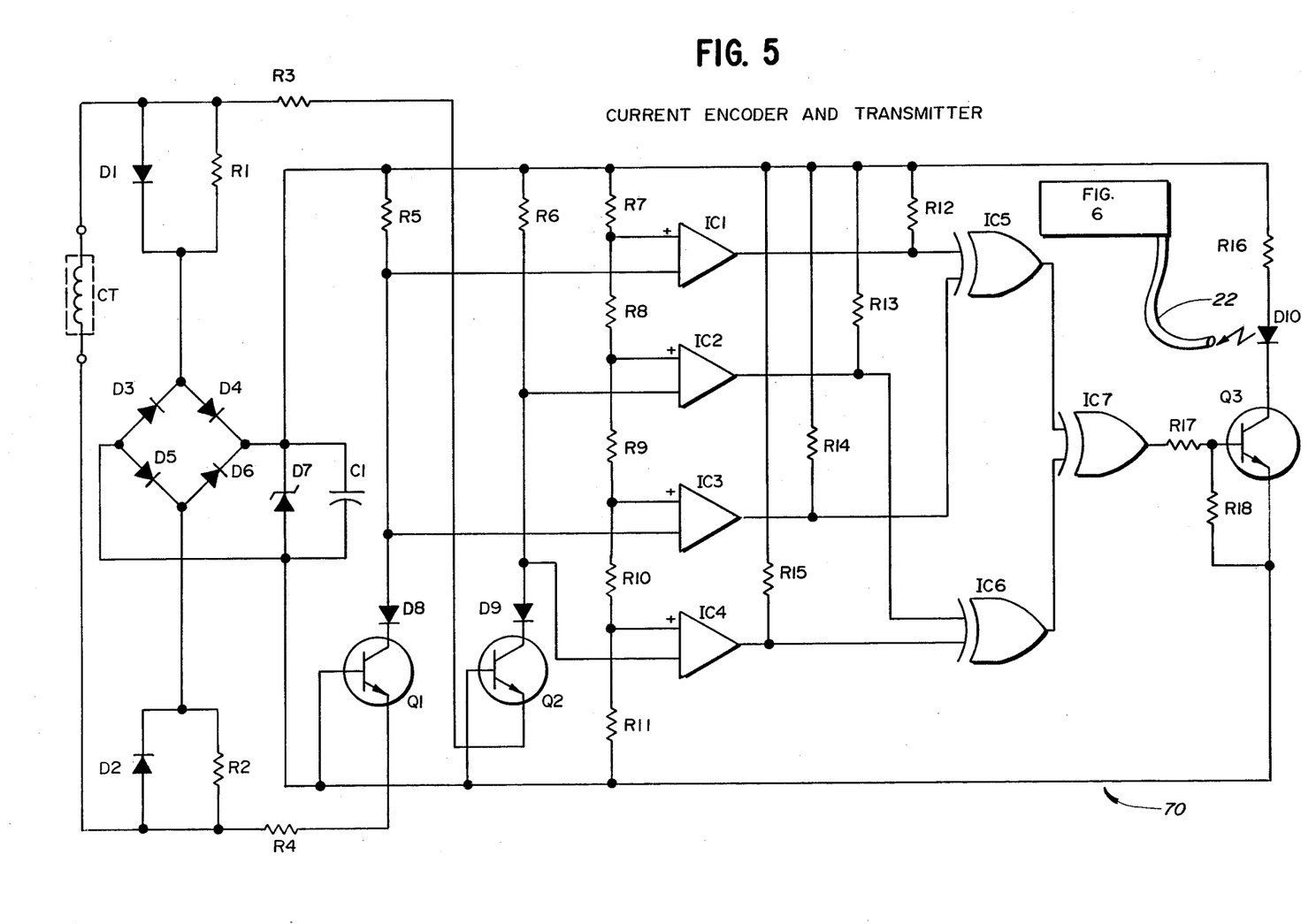
FIG. 5 is a schematic diagram of the Current Encoder and Transmitter portion of one embodiment of the invention.

Turning to FIG. 5, one embodiment of a Current Encoder and Transmitter 70 is schematically depicted. This electronic assembly 70 may be carried by the two-part current transformer of FIG's. 2 and 3, and may be connected to the enclosure 14 of FIG. 1A by a fiber optic link 22. The current transformer CT, when connected around the distribution line 12 reproduces the line current at its output terminals, reduced by the CT turns ratio. The output of the CT is used to establish a D.C. level reference and to produce a D.C. voltage level representative of the D.C. current flowing through the distribution line 12. Resistors R3 and R4 are selected so that they are much larger than resistors R1 and R2 and the effective impedance of a zener diode D7. This is done so almost all of the current goes through the circuit with which includes the bridge formed by diodes D3 through D6. The zener diode D7 and its capacitor C1 will establish a fixed D.C. voltage, approximately 10 volts. Depending on the current flowing, resistors R1 and R2 will develop a voltage proportional to the line current flowing therein.

When the current through the transformer CT has an instantaneous direction from "top to bottom" (according to the orientation of FIG. 5), diode D1 shorts resistor R1 and system current appears as an IR drop across R2. Resistor R2 is then effectively in parallel with resistor R4 including the effects of transistor Q1 (2N3904, NPN) and diode D8, respectively. Thus, their currents are proportional. In other words, the transistor Q1 emitter current is essentially equal to the collector current and the current in resistor R4 is equal to the current in resistor R5. The net effect is that the current in R5 is proportional to the line current.

Similarly, during the opposite half-cycle, the current in resistor R6 is proportional to the line current during that half-cycle.

Disposed across or in parallel with the combination of the zener diode D7 and capacitor C1 is a series of five resistors R7 through R11. Four of these resistors has one of its ends connected to a voltage comparator IC1 through IC4. Two of the comparators IC1 and IC3 have their other input terminal connected together so as to follow the current during one half-cycle, while the other two comparators IC2 and IC4 have their input terminals connected so as to follow the current during the other half cycle. Effectively, the series resistors R7 through R11 and the comparators IC1 through IC4 determine a series of threshold levels. These levels are depicted relative to the ten volt C.D. line voltage established by zener diode D7 and its capacitor C1 in FIG. 7. The threshold values (i.e., T1, T2, T4, and T8) established by voltage comparators IC1 through IC4, are approximately 1, 2, 4, and 8 volts below the 10 volt D.C. line voltage that each comparator is referenced to. As the line current increases, the IR drop across R5 and R6 increases, thereby causing the comparators IC1 through IC4 to turn on sequentially.

Figure 7:
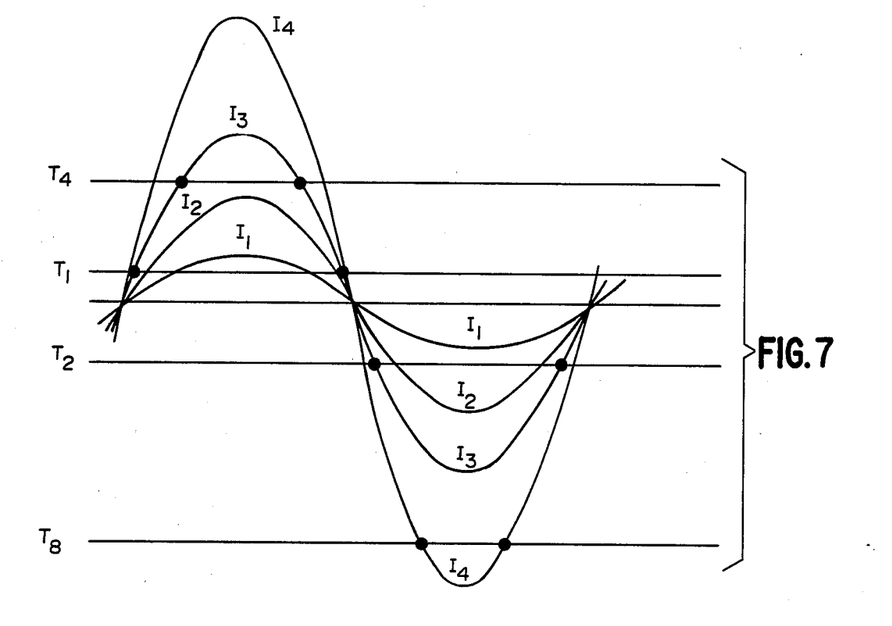
FIG. 7 is a graph of four alternating current wave forms superimposed upon four threshold voltage levels established by the apparatus of FIG. 5.

Turning now to FIG. 7, this figure shows one cycle of electrical current for four different current amplitudes I1 through I4. The figure also depicts four threshold levels T1, T2, T4, and T8. It should be noted that the threshold levels T1 and T4 are paired on one half of the A.C. cycle and T2 and T8 are paired on the other half cycle. In this regard (See FIG. 5), resistors R2 and R5, and transistor Q1 (2N3904, NPN) are related to comparators IC1 and IC3 which, in turn, are related to threshold values T1 and T4. Similarly, resistors R1 and R6 and transistor Q2 (2N3904, NPN) are related to comparators IC2 and IC4 which are related to threshold values T2 and T8.

Figure 8:
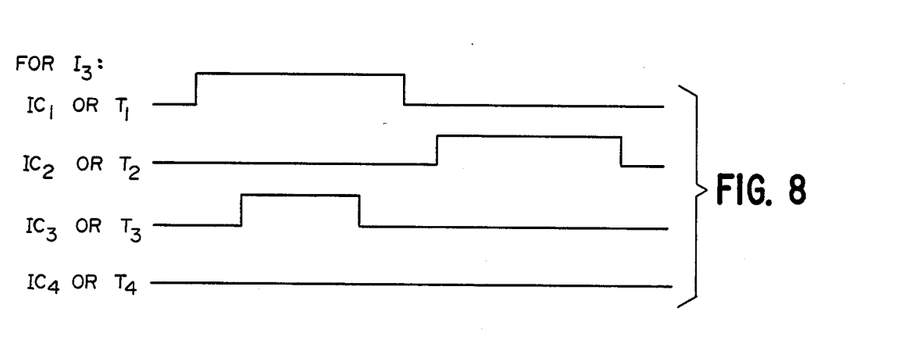
FIG. 8 illustrate the voltage levels produced from the comparators in the schematic diagram of FIG. 5 for one of the current wave forms shown in FIG. 7.

Turning of FIG. 8, this figure shows the output of the four comparators in responding to current level I3 in FIG. 3. Since I3 exceeds thresholds T1 and T4, both voltage comparators IC1 and IC3 show transitions when the instantaneous current I3 crosses the thresholds. For the next half cycle, IC3 exceeds threshold T2, but not T8, and the output of voltage comparators IC2 and IC4 reflect this situation.

Returning to FIG. 5, connected to the outputs of the voltage comparators are a series of three exclusive-OR gates IC5, IC6 and IC7. These gates drive an LED D10 through a transistor Q3 (2N3904, NPN). FIG. 8 is a truth table for an exclusive-OR gate. Simply stated, if the inputs to such a gate are the same, the output is low, if the inputs are different, the output is high.

Figure 9:
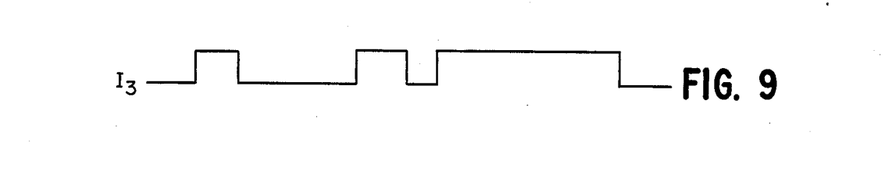
FIG. 9 depicts the composite voltage signal used to drive the LED of FIG. 5.

Turning to FIG. 9, there is depicted the output of exclusive-OR gate IC7 for the four current levels illustrated in FIG. 8. In other words, the output of exclusive-OR gate IC7 is a train of voltage signals the duration of which are characteristic of the magnitude of the current I3.

Figure 6:
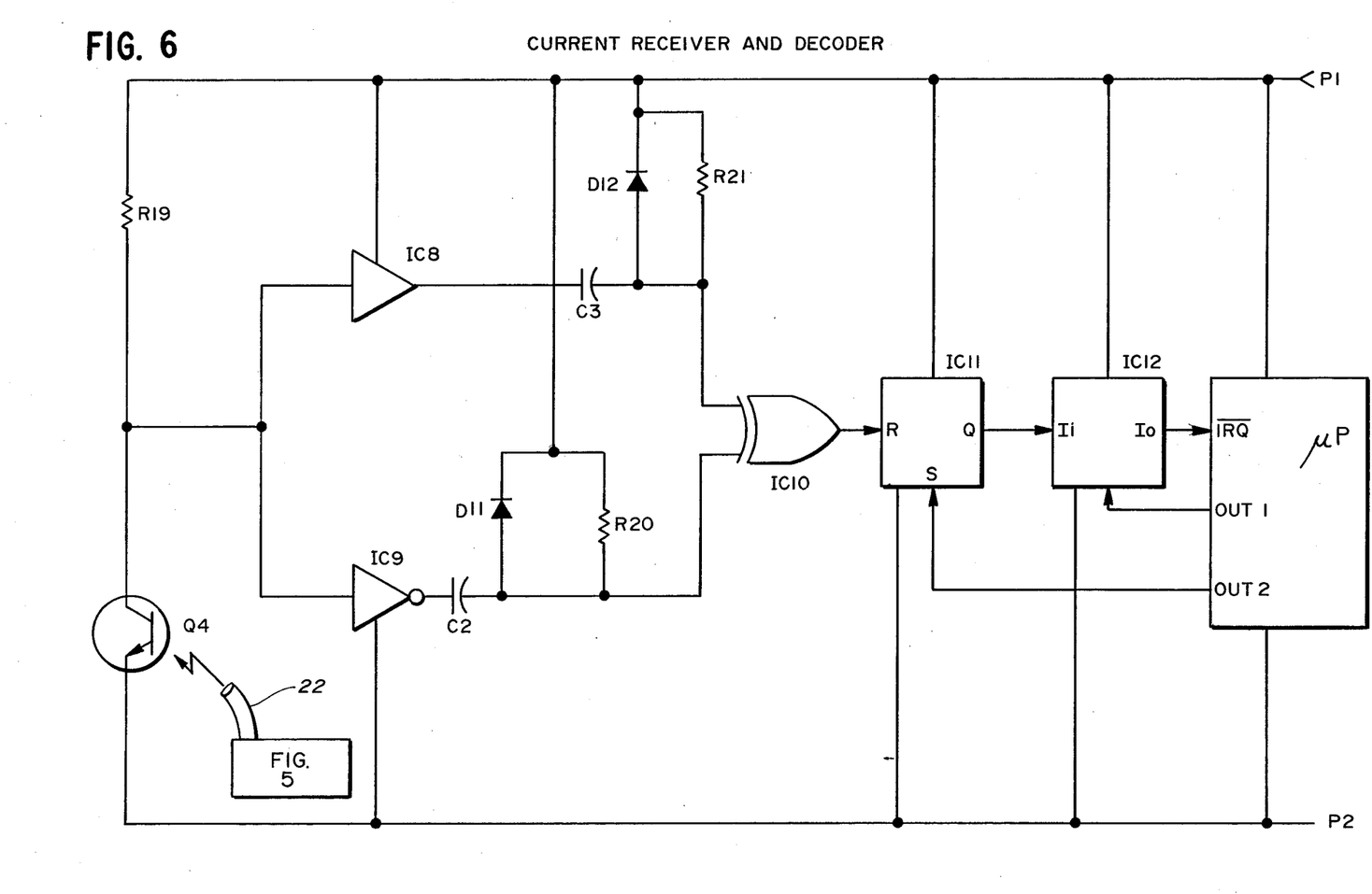
FIG. 6 is a schematic diagram of the Current Receiver and Decoder portion of the invention.
Figure 10:
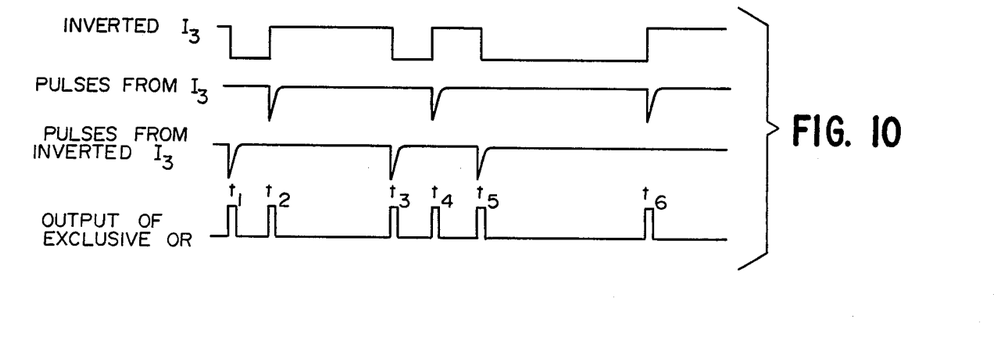
FIG. 10 depicts the signals produced within the apparatus of FIG. 6.

Turning to FIG. 6, the output or light pulses produced by LED D10 is coupled to a photo-transistor Q4 (MRD 310) by means of a fiber optic link 22. The photo-transistor Q4 is in series with a resistor R19 which are disposed across the two terminals of a power supply, P1 and P2. The output of the combination of the photo-transistor Q4 and resistor R19 drives amplifier IC8 and inverter amplifier IC9. The outputs of amplifiers IC8 and IC9 drive an exclusive-OR gate IC10. FIG. 10 represents the wave shapes. The combination of IC8 and IC9 will produce a negative going signal for each transition (positive or negative) of the input signal at Q4. Capacitors C2 and C3, diodes D11 and D12, and resistors R20 and R21 defined a pulse forming network to cause a negative pulse to appear at the exclusive-OR gate IC10. The output of the exclusive-OR gate IC10 drives the "reset" terminal of a D-type flip-flop IC11 (CD4013B). This causes a fixed output Q until the flip-flop IC11 is "set". This flip-flop IC11 is used to drive the interrupt of a microprocessor IC13 (Motorola 6805). The interrupt is selected to call a program or subroutine that obtains the time from an internal clock and stores that time in random access memory (RAM). On completion of this operation, the microprocessor is programed to provide a signal (OUT-2) to "set" the flip-flop IC11 to receive the next transition.

Connected to the output Q of flip-flop IC11 is a transmission gate IC12 (CD4016B). This gate is turned "on" for one electrical cycle of the power line, approximately 16,667 us (microseconds), to limit data sent to the microprocessor to permit easier decoding of the data to determine the line current. This feature will become more understandable from the discussion which follows.

Turning to the microprocessor IC13, that microprocessor incorporates a software program to determine the line current values from the pulse train starts by counting the number of transitions stored in RAM over one cycle. The following cases would be covered by that software program.

Case I

This is the default case (i.e., no transitions). In this case, the current does not cross any of the thresholds. A default current value amounting to the maximum possible current that would result in such a situation can be established within the microprocessor.

Case II

Figure 11:
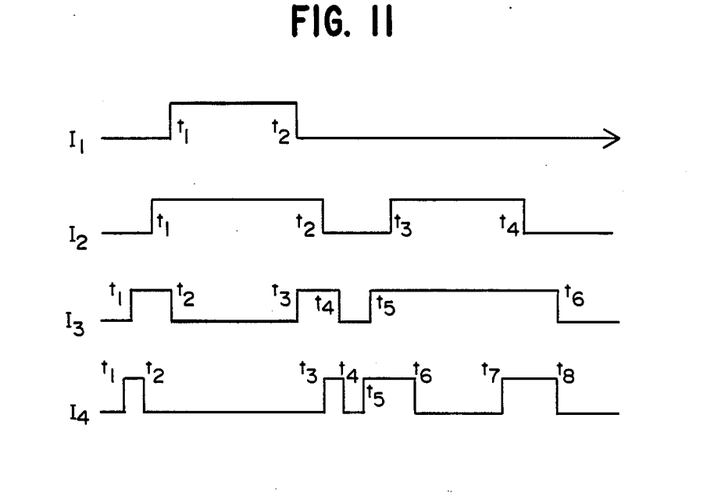
FIG. 11 depicts the pulse trains resulting from the four current wave forms shown in FIG. 7 when decoded by the apparatus of FIG. 6.
Figure 12:
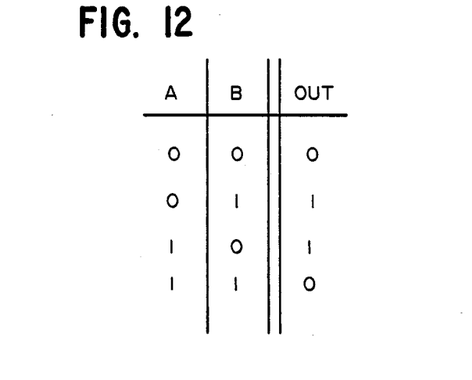
FIG. 12 is a truth table for an exclusive-OR gate.

In this case, there are only two transitions within a cycle. This situation is depicted in FIG. 11 as current I1. If the time difference between the two times $t_1$ and $t_2$ is less than one half cycle (i.e., less than 8333 microseconds), then a look-up table can be used to obtain the current value. Otherwise, the time should be subtracted from 16,667 microseconds, and that value used in the look-up table.

Case III

This case covers a situation wherein there are four transitions within a cycle (I2 of FIG. 11). Here four time differences or slots are calculated:

$$t_2 - t_1 = t_{21}$$

$$t_3 - t_2 = t_{32}$$

$$t_4 - t_3 = t_{43}$$

$$t_1 + 16,667 \text{ us} - t_4 = t_{14}$$

These time are checked to find the largest time slot. If the current was relatively high (i.e., within the confines of the four transition states established), the largest time slot will approach 8333 microseconds and have relatively little resolution. If this the case, then the time slot to be used would be the time related to the other half cycle (i.e., this time is located two time slots away, depending on where the sample started on the current wave). A look-up table would then give the current.

Case IV

This case has six transitions within a cycle and is shown as I3 in FIG. 11. The determination of the line current for this situation can be determined by considering:

1. Are the times $t_{21}$ and $t_{43}$ equal or nearly equal? If so, these times can be used to locate time slot $t_{32}$ and a look-up table will give the current.
2. The time $t_{65}$ will always be the greatest time interval of this case and will always be three time slots from time $t_{32}$. Again, a look-up table can be used.

Case V

This case has eight transitions within a cycle and is depicted as I4 in FIG. 11. Again, two possible keys exist for determining the line current from this pattern:

1. There are two pairs or times that serve as "pointers" to the key time intervals. If time interval $t_{21}$ equals time interval $t_{32}$ and time interval $t_{65}$ equals time interval $t_{87}$, time intervals $t_{32}$ and $t_{76}$ can be used in a look-up table to obtain the line current. If time interval $t_{43}$ has a value nearing one half cycle (say greater than 8,000 microseconds), then time interval $t_{76}$ should be used in another look-up table.
2. Alternatively, the eight time intervals can be searched for the largest and the second largest. These two values can then be used in the look-up scheme described above.

If for some reason an odd number of data points are read, or if more than eight are read, then the program within the micro-processor should be written so as to disregard the data and obtain a new set of information.

Electronic Circuitry (Second Embodiment)

Figure 13:
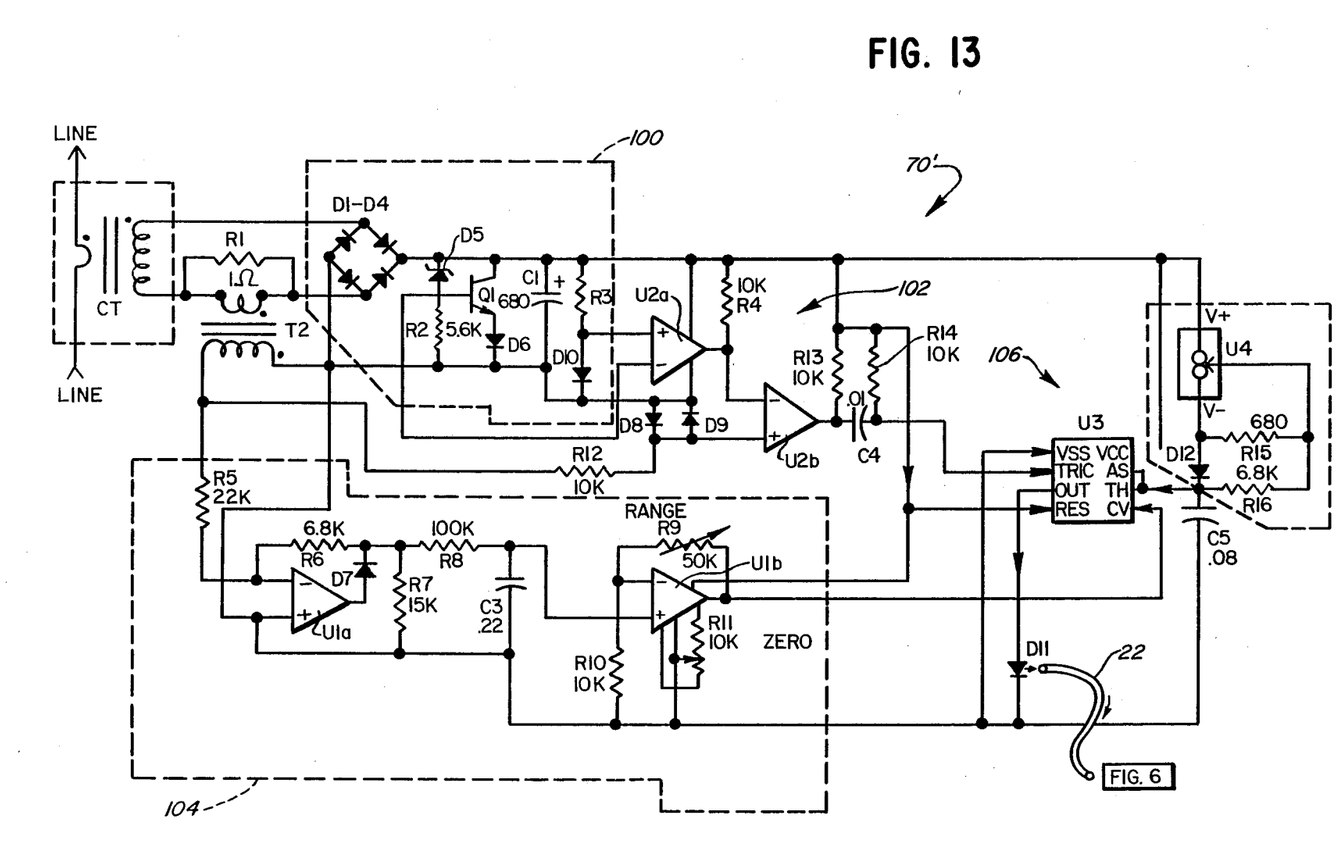
FIG. 13 is another embodiment of the Current Encoder and Transmitter portion of the invention.

Turning to FIG. 13, another embodiment of the Current Encoder and Transmiter 70' is schematically depicted.

Figure 1A:
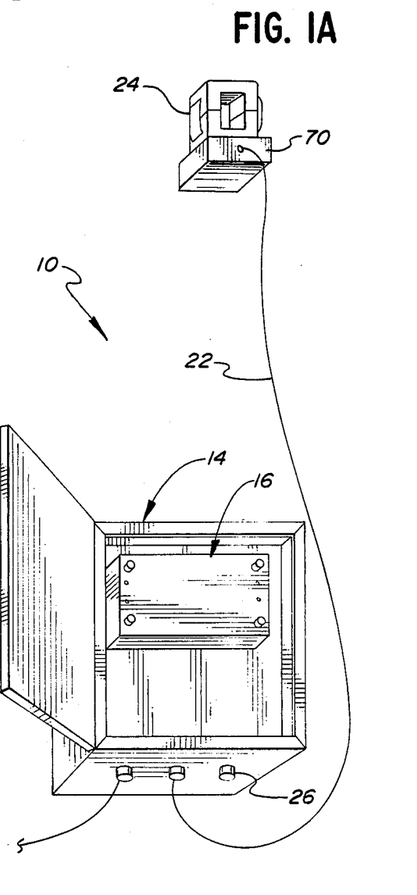
FIG. 1A is an enlarged pictorial representation of a Distribution Line Data Base Recorder incorporating the apparatus that is the subject of this patent.

As before the electronic assembly 70' is preferably carried by the two-part current transformer of FIG's. 2 and 3, and connected to the enclosure 14 of FIG. 1A by fiber optic link 22. The apparatus depicted in FIG. 13 has four sections: a power supply 100, a zero-crossing detector 102, an A.C. to D.C. converter 104, and a pulse duration generator 106. Basically, the current transformer CT converts line currents into a zero-crossing referenced voltage signal whose duration is characteristic of the magnitude of the A.C. current flowing through the line and a train of light pulses which characterize the magnitude of the A.C. current flowing through the line.

Turning now to the power supply 100, the current flowing in the primary of the current transformer CT is divided by its turns ratio (250:1) and is full-wave rectified by diode bridge D1-D4 (1N5625). The rectified current is converted to a voltage across a capacitor C1 which also filters the input to the regulator section which follows. Diodes D5 (1N5243) and D6 (1N5625), resistor R2, and transistor Q1 (13007) form a shunt-type voltage regulator. When the incoming voltage exceeds the zener voltage of D5 (i.e., 14 volts), D5 conducts turning on transistor Q1 which clamps the bus to 15.2 volts (i.e., 14 volts plus two diode drops).

Figure 14A:
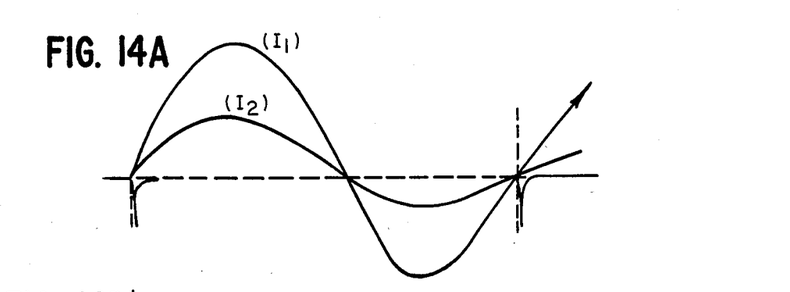
Figure 14B:
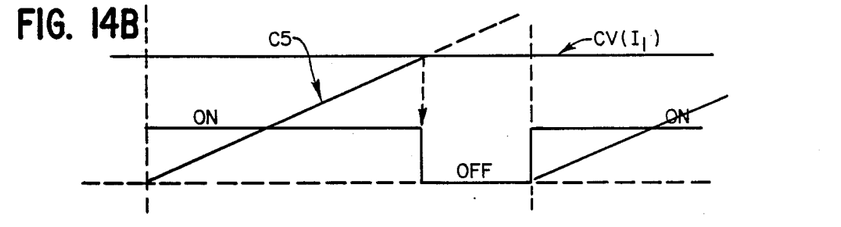
Figure 14C:
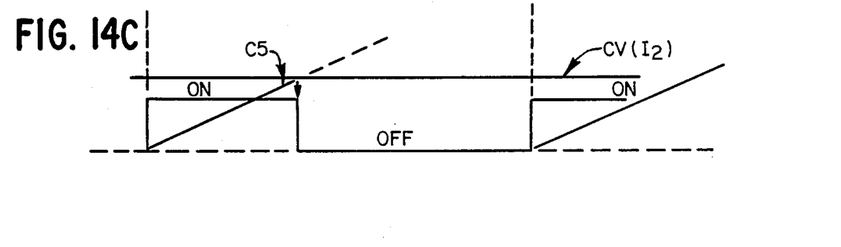

Turning now to the zero-crossing detector 102, current flowing out of the secondary of the current transformer CT is converted to a voltage by resistor R1 and is stepped up (1:10) by transformer T2. The A.C. wave is then passed to a zero-crossing circuit composed of comparators U2a (CA3290) and U2b, diodes D8 through D10 (1N914), resistors R3, R4, R12 through R14, and capacitor C4. The incoming A.C. wave is clipped to plus (+) or minus (−) 0.6 volts by resistor R12 and diodes D8 and D9. Comparator U2b compares this voltage with its non-inverting input and switches its output accordingly. When diode D5 conducts, the voltage at the inverting input of comparator U2a rises to 1.2 volts. This exceeds the 0.6 volts on the non-inverting input established by resistor R3 and diode D10; this, in turn, causes the output of U2a to go "low", bringing the non-inverting input of comparator U2b to its "low" condition. This insures that the zero-crossing detector is disabled, if there is not sufficient voltage to properly operate the circuitry. The output of comparator U2b is differentiated by capacitor C4 and resistor R14 to form a series of negative going pulses referenced to the positive going zero-crossing of the incoming A.C. wave (See FIG. 14A).

The A.C. to D.C. converter 104 will now be discussed. The A.C. wave from transformer T2 is also passed to an absolute value circuit formed by operational amplifier U1a (CA3290), resistors R5 through R7, and diode D7 (1N914). As the wave goes through its negative half-cycle, the inverting input of amplifier U1a goes "negative", thus its input goes "positive" and the gain is proportional to minus (−) R6/R5. When the wave goes through it positive half-cycle, diode D7 effectively removes amplifier U1a from the circuit; thus the gain of the circuit is R7(R5+R6+R7). Resistor R8 and capacitor C3 form a filter for the rectified wave. Amplifier U1b and resistors R9 through R11 form a scaling buffer which allows the zero to be set (R11) and the range to be set (R9).

Figure 13A:
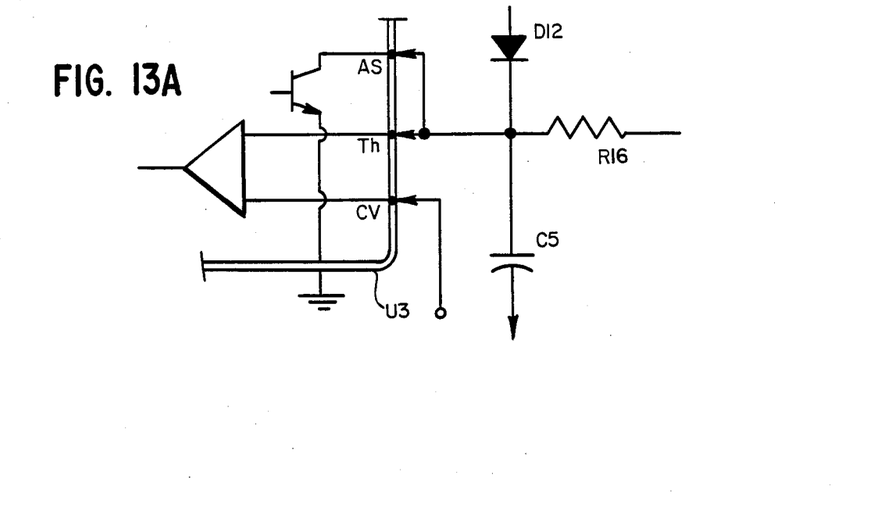

Finally, there is the pulse duration generator 106. The pulse duration generator is composed of timer U3 (7555), current generator U4 (LM134), resistors R15 and R16, capacitor C5, light emitting diode D11 and diode D12 (1N457). The timer U3 is used in its monostable mode. The zero-crossing detector pulses trigger U3 which set its output "high", turns on D11 and starts charging capacitor C5. This capacitor C5 is charged from a temperature compensated constant current source formed by U4, R15, R16, and D12. This circuitry provides for a wide linear operating range. When the voltage across capacitor C5 equals the voltage (See FIG's. 14B and 14C) on the control voltage input Cv, timer U3 switches off its outut which shuts the LED (D11) off, shorts capacitor C5 (See FIG. 13A), and stands-by for another trigger input from the zero-crossing detector 102. Thus, the width of the output light pulse is directly related to the current flowing in the current transformer CT and its rising edge is reference to the positive zero-crossing of the A.C. current wave form. As before, the output of the LED (D11) is optically coupled through a link 22 to an apparatus such as the circuitry shown in FIG. 6.

From the foregoing, it will be observed that numerous variations and modifications may be effected without departing from the true spirit and scope of the novel concept of the present invention. For example, U.S. Pat. No. 4,625,283 describes a method and apparatus for digitally measuring alternating current. That apparatus uses an ordinary current transformer. That apparatus would be equally applicable to the current transformer illustrated in FIG's. 2 and 3 of this application. Similarly, U.S. Pat. No. 4,630,218 describes a current measuring apparatus which makes use of a current transformer and a fiber optic cable. The current encoder and transmitter shown in FIG.'s 5 and 13 may be used to feed the optical fiber cable of the '218 patent. Similarly, the optical fiber cable of the '218 patent can be used in conjunction with the current receiver and decoder in FIG. 6 of this application. Thus, it should be understood that no limitation with respect to the specific apparatus illustrated herein should be intended or inferred. It is, of course, intended to cover by the appended claims all such modifications as fall within the scope and spirit of the claims.

I claim:

1. Apparatus for monitoring an A.C. distribution line having A.C. current which flows therethrough and which is characterized by an RMS value and a magnitude, comprising:
   (a) a current transformer having means for removably clamping it about said line while being inductively coupled to and electrically insulated from said line; and
   (b) encoding means, carried and powered by said current transformer, for producing a train of voltage signals having a duration which is characteristic of said magnitude of said A.C. current flowing through said line and for producing a train of light pulses from said voltage signals which characterize said magnitude of said A.C. current flowing through said line, said encoding means comprising:
      (1) zero-crossing detector means for producing a starting pulse reference to the positive zero-crossing of the A.C. current through the distribution line;
      (2) A.C. to D.C. converter means for converting the output of said current transformer to a D.C. voltage signal level which is proportional to said magnitude of said A.C. current;
      (3) comparison means, charging a capacitor from a constant current source upon the receipt of said starting pulse, for producing an off-signal when said capacitor is charged to said D.C. voltage signal level; and
      (4) means, operatively connected to said zero-crossing detector means and said comparison means, for producing a light pulse which begins upon the receipt of said starting pulse and which ends upon the receipt of said off-signal and for discharging said capacitor upon the receipt of said off-signal.

2. The apparatus of claim 1, wherein said light pulses are separated by time intervals, and further including:
   (a) decoding means, spaced apart and electrically isolated from said encoding means, for measuring said time intervals between said light pulses and for converting said train of light pulses into a numerical value representing the current flowing through said line; and
   (b) a fiber optic link for transmitting said train of light pulses from said encoding means to said decoding means.

3. The apparatus set forth in claim 2, wherein said decoding means includes a pulse forming network for converting said train of light pulses to a train of voltage pulses of constant width.

4. The apparatus set forth in claim 3, further including:
   a microprocessor which has been programmed to accept said train of voltage pulses from said pulse forming network, to count said pulses, to determine the time intervals between said pulses, and to compare said time intervals against a look-up table stored in said microprocessor to calculte said RMS value of said A.C. current in said line.

5. Apparatus for monitoring an A.C. distribution line having A.C. current which flows therethrough and which is characterized by an RMS value and a magnitude, comprising:
   (a) a current transformer having means for removably clamping it about said line while being inductively coupled to and electrically insulated from said line; and
   (b) encoding means, carried and powered by said current transformer, for producing a train of voltage signals having a duration which is characteristic of said magnitude of said A.C. current flowing through said line and for producing a train of light pulses from said voltage signals which characterize said magnitude of said A.C. current flowing through said line, said encoding means comprising:
      (a) D.C. level means, operated in response to said current transformer, for producing a generally fixed D.C. voltage which is dividable into at least four D.C. voltage levels;
      (b) first half-cycle means, operated in response to the output of said current transformer, for producing a first voltage which is proportional to the current flowing through said line over one-half of the period of said A.C. current;
      (c) second half-cycle means, operated in response to the output of said current transformer, for producing a second voltage which is proportional to the current flowing through said line over the remaining half of the period of said A.C. current; and
      (d) sequential comparison means, comparing said first voltage and at least two of said four D.C. voltage levels and comparing said second voltage and at least the remaining two of said four D.C. voltage levels, for producing said train of voltage signals which are characteristic of said magnitude of said A.C. current flowing through said line.

6. The apparatus of claim 5, wherein said current transformer is electro-magnetically connected to and electrically isolated from said A.C. distribution line.

7. The apparatus of claim 4, wherein said train of voltage signals are initiated at a positive zero-crossing of said A.C. current.

8. The apparatus set forth in claim 5, wherein said D.C. level means includes:
   (a) a first diode in parallel with a resistor;
   (b) a second diode in parallel with a second resistor; and
   (c) a bridge rectifier having one input connected to the parallel combination of said first diode and first resistor and having a second input connected to the parallel combination of said second diode and said second resistor.

9. The apparatus set forth in claim 8, wherein said current transformer has two output terminals and said bridge rectifier has two outputs, and wherein said first half-cycle means includes:
   (a) a third resistor having one end connected to one of said two outputs of said bridge rectifier;
   (b) a third diode having one end connected to the other end of said third resistor;
   (c) a fourth resistor having one end connected to one of said two output terminals of said current transformer; and
   (d) a first NPN transistor having a base connected to the other of said two outputs of said bridge rectifier, a collector connected to other end of said third diode, and having an emitter connected to the other end of said fourth resistor.

10. The apparatus set forth in claim 8, further including a zener diode and a capacitor, wherein the output of said bridge rectifier is connected to the parallel combination of said capacitor and said zener diode, whereby a D.C. voltage level is established across said capacitor and zener diode.

11. The apparatus set forth in claim 10, wherein said first resistor and said second resistor are selected such that said current transformer produces a voltage across them which is proportional to the current through said line.

12. The apparatus set forth in claim 10, further including five resistors connected in series with each other and in parallel with said zener diode and said capacitor.

13. The apparatus set forth in claim 5, wherein said sequential comparison means includes four voltage comparators, each of said voltage comparators having an input connected to one of said at least four D.C. voltage levels, two of said comparators having an input connected to said first half-cycle means, and the remaining two of said four comparators being connected to said second half-cycle means, whereby as line current increases said comparators are turned on sequentially.

14. The apparatus set forth in claim 13, further including:
  (a) a first exclusive-OR gate whose inputs are connected to the outputs of said two voltage comparators;
  (b) a second exclusive-OR gate whose inputs are connected to the outputs of said two remaining voltage comparators; and
  (c) a third exclusive-OR gate whose inputs of which are connected to the outputs of said first exclusive-OR gate and said second exclusive-OR gate.

15. The apparatus set forth in claim 14, further including:
  (a) a switch which operates in response to the output of said third exclusive-OR gate; and
  (b) a LED in series with said switch, the series combination of said switch and said LED being connected across said D.C. level means.

16. The apparatus set forth in claim 15, wherein said LED is optically connected to a photo-transistor.

17. Apparatus for monitoring an A.C. distribution line having A.C. current which flows therethrough and which is characterized by an RMS value and a magnitude, comprising:
  (a) a current transformer having means for removably clamping it about said line while being inductively coupled to and electrically insulated from said line;
  (b) encoding means, carried and powered by said current transformer, for producing a train of voltage signals having a duration which is characteristic of said magnitude of said A.C. current flowing through said line and for producing a train of time separated light pulses from said voltage signals which characterize said magnitude of said A.C. current flowing through said line; and
  (c) decoding means, spaced apart and electrically isolated from said encoding means, for measuring said time intervals between said light pulses and for converting said train of light pulses into a numerical value representing the current flowing through said line, said decoding means including a pulse forming network for converting said train of light pulses to a train of voltage pulses, said pulse forming network including an exclusive-OR gate having an output to drive a microprocessor; and
  (d) a fiber optic link for transmitting said train of light pulses from said encoding means to said decoding means.

18. Apparatus for monitoring an A.C. distribution line having A.C. current which flows therethrough and which is characterized by an RMS value and a magnitude, comprising:
  (a) a current transformer having means for removably clamping it about said line while being inductively coupled to and electrically insulated from said line;
  (b) encoding means, carried and powered by said current transformer, for producing a train of voltage signals having a duration which is characteristic of said magnitude of said A.C. current flowing through said line and for producing a train of time separated light pulses from said voltage signals which characterize said magnitude of said A.C. current flowing through said line; and
  (c) decoding means, spaced apart and electrically isolated from said encoding means, for measuring said time intervals between said light pulses and for converting said train of light pulses into a numerical value representing the current flowing through said line, said decoding means including:
    (1) a pulse forming network for converting said train of light pulses to a train of voltage pulses;
    (2) a microprocessor which has been programmed to accept said train of voltage pulses, to count said voltage pulses, to determine the time intervals between said voltage pulses, to compare said time intervals against a look-up table stored in said microprocessor, and to calculate said RMS value of said A.C. current in said line; and
    (3) a flip-flop having a RESET-input driven by said train of voltage pulses, a SET-input triggered by an output from said microprocessor, and an OUTPUT which is connected to an input port of said microprocessor, said microprocessor having been programmed to provide an INTERRUPT-output signal which goes to said SET-input which is gated by said OUTPUT of said flip-flop.

19. The apparatus set forth in claim 18, further including a gate having an INPUT connected to the output of said flip-flop and an OUTPUT which is connected to said input port of said microprocessor, said gate being triggered into operation in response to an output signal from said microprocessor.

20. Apparatus, comprising:
  (a) a clamp-on transformer which is configured to be removably attached and electrically insulated from an A.C. distribution line having current flowing therethrough, said transformer having a magnetic core and a secondary winding with a primary winding of said transformer being formed by said A.C. distribution line;
  (b) encoding means, comparing a voltage which is derived from said secondary of said transformer and which is a function of the magnitude of said A.C. current to one reference voltage which is derived from said secondary of said transformer, for producing a coded sequence of light pulses which are characteristic of said A.C. current flowing through said line, said one reference voltage being produced by a capacitor which is charged by a constant current source beginning at a zero-crossing of said A.C. line current;

(c) microprocessor means, which is physically remote from said transformer and said encoding means, which has been programmed with a look-up table to compute, from the duration of said light pulses, said electrical current flowing through said line; and (d) means for sending light pulses from said encoding means to said microprocessor means and for converting said light pulses to digital values readable by said microprocessor means.

21. The apparatus of claim 20, wherein said current transformer, comprises:

(a) a split transformer core which is configured to encompass a distribution line conducting A.C electricity and which comprises two parts;

(b) transforming means, carried by one of said split core parts, for transforming current flowing through said distribution line to an electrical conductor having two ends;

(c) connecting means for connecting together said two split core parts such that at least one of said core parts is free to move relative to the other between a closed positon and an open position where said distribution line is free to pass out of said core; and (d) moving means, carried by said one part and connected to said other core part and operable at a spaced distance from said distribution line, for moving said two core parts between said open position and said closed position and for applying uniform force in holding said core parts together.

22. The apparatus of claim 21, wherein said hinge comprises a circular pin, one hinge plate having a circular aperture for said pin, and a second hinge plate having a generally elongated aperture for receiving said pin, whereby said pin and said one plate are free to rotate and move relative to said second plate along the axis of said elongated aperture.

23. The apparatus of claim 21, wherein each of said core parts is encapsulated with an epoxy electrical insulating material.

24. The apparatus of claim 21, wherein said transforming means comprises a bobbin which is disposed around at least a portion of said core part and comprising an electrical conductor having two ends, at least a portion of said electrical conductor between said two ends being wrapped around said bobbin.

25. The apparatus of claim 21, wherein each core part defines two ends and said one core part has one end which mates with one end of the other core part.

26. The apparatus of claim 21, wherein each core part defines two ends and further including means for aligning one end of said one core part to one end of the other core part.

27. The apparatus of claim 21, wherein said moving means comprises a threaded shaft carried by said frame and engaging said other core part.

28. The apparatus of claim 21, wherein said connecting means is a piano hinge.

29. The transformer of claim 28, wherein said arm has a ring at one end and has said threaded section at the opposite end and wherein said arm is linked to said other core part.

30. The apparatus of claim 21, wherein said moving means comprises:

(a) a frame carried by said one core part;

(b) a rod carried by said frame defining a threaded section; and (c) an arm linked to the other of said core parts, carried by said frame and engaging said threaded section of said rod, whereby rotation of said rod in one direction brings said two core parts to their open position and rotation in the opposite direction brings said two core parts to their closed position.

31. The apparatus of claim 30, wherein said encoding means is carried by said frame.

32. The apparatus of claim 21, wherein:

(a) said connecting means comprises a frame carried by said one core part;

(b) said one core part is generally U-shaped and is fixed to said frame; and (c) the other core part is carried by said frame so as to be free to move toward and away from the open end of said U-shaped core part.

33. The apparatus of claim 32, wherein said one end of said one core part defines a groove and said one end of the other core part defines a land which is configured to fit within said groove when said core is in its closed position, whereby said two core parts are self-aligning.

34. Apparatus for monitoring an A.C. distribution line having A.C. current which flows therethrough and which is characterized by an RMS value and a magnitude, comprising:

(a) a current transformer having means for removably clamping it about said line while being inductively coupled to and electrically insulated from said line; and (b) encoding means, carried and powered by said current transformer, for producing a train of voltage signals having a duration which is characteristic of said magnitude of said A.C. current flowing through said line and for producing a train of light pulses from said voltage signals which characterize said magnitude of said A.C. current flowing through said line, each of said voltage signals being initiated at a positive zero-crossing of said A.C. current and only one voltage signal being produced for each cycle of said A.C. current.

35. Apparatus for monitoring an A.C. distribution line having A.C. current which flows therethrough and which is characterized by an RMS value and a magnitude, comprising:

(a) a current transformer having means for removably clamping it about said line while being inductively coupled to and electrically insulated from said line; and (b) encoding means, carried and powered by said current transformer, for producing a train of voltage signals having a duration which is characteristic of said magnitude of said A.C. current flowing through said line and for producing a train of light pulses from said voltage signals which characterize said magnitude of said A.C. current flowing through said line, said encoding means comprising:

(a) a zero-crossing detector powered by said current transformer;

(b) an A.C. to D.C. converter for producing a voltage level which is proportional to the current flowing through said A.C. distribution line;

(c) a capacitor and means for producing a constant current to charge said capacitor and establish a threshold voltage, whereby a time to reach said threshold voltage is established; and (d) signaling means, operating in response to said zero-crossing detector, for turning ON a light source at the beginning of said A.C. current wave form and for shutting OFF said light source when said threshold voltage is generally equal to said voltage level, whereby the duration that said light source was ON is a characteristic of said magnitude of said A.C. current flowing through said line.

36. The apparatus of claim 35, wherein said signaling means comprises:

(a) a mono-stable multi-vibrator which has an output connected to an LED and an input which is connected to said zero-crossing detector and which is used for triggering the multi-vibrator to one state and turning ON said LED; and (b) means, connected to said threshold voltage and said voltage level, for controlling the duration that said multi-vibrator is in said one state.

37. The apparatus of claim 35, wherein said means for producing a constant current is a temperature compensated constant current source.

38. Apparatus for metering the A.C. current flowing through a line conductor, said current being characterized by a magnitude, a period, and an RMS value, comprising:

(a) a current transformer removably carried by the line;

(b) D.C. level means, operated in response to said current transformer, for producing a D.C. voltage level;

(c) voltage means, operated in response to said current transformer for producing a voltage level characteristic of the current through said line;

(d) first half-cycle means, operated in response to said voltage means, for producing a current signal through a first resistor and thereby a first voltage, said current signal being proportional to the current flowing through said line over the one half of said period of said A.C. current;

(e) second half-cycle means, operated in response to said voltage means, for producing a current signal through a second resistor and thereby a second voltage, said current signal being proportional to the current flowing through said line over the remaining half of said period of said A.C. current;

(f) voltage dropping means, across said D.C. level means, for producing at least four levels of voltage;

(g) sequential comparison means, comparing said first voltage with two of said four level voltages and comparing said second voltage with the remaining two of said four level voltages, for producing a train of light pulses whose duration is characteristic of said magnitude of said current flowing through said line;

(h) a pulse forming network for taking said train of light pulses and converting them to a train of voltage pulses;

(i) a flip-flop characterized by transitions and having an OUTPUT, a RESET-input driven by said pulse forming network and having a SET-input; and (j) a microprocessor which has been programmed to provide for an interrupt which is gated by the OUTPUT of said flip-flop, said microprocessor having an output which is connected to said SET-input of said flip-flop and being programmed to gate said flip-flop to an ON condition for at least one electrical cycle, to count the number of transitions of said flip-flop which are gated into said microprocessor by said interrupt, to determine time intervals between transitions of said train of pulses, and to calculate said RMS value of said current flowing through said line using said time intervals.

39. The apparatus set forth in claim 38, wherein said D.C. level means produces a generally fixed D.C. voltage level.

40. The apparatus set forth in claim 38, wherein said sequential comparison means includes three exclusive-OR gates with the outputs of two exclusive-OR gates being the inputs of the remaining exclusive-OR gate.

41. The apparatus set forth in claim 38, wherein said pulse forming network is optically isolated and physically remote from said sequential comparison means.

42. The apparatus set forth in claim 38, further including gating means, operated in response to an output of said microprocessor, for inputting the output of said flip-flop to said interrupt of said microprocessor.

43. The apparatus set forth in claim 38, wherein said microprocessor has been programmed to include a look-up table for correlating said time intervals to RMS values of A.C. current.

44. Apparatus, comprising:

(a) a current transducer having means for removably connecting it around an A.C. current conducting line while remaining electrically insulated from said line, said transducer having two output terminals and an iron core comprising two parts which are movable between an open position to accept said line and a closed position around said line;

(b) a D.C. power supply, connected to the output terminals of said transducer, for producing at least four D.C. voltage levels, said D.C. power supply including a bridge rectifier and a parallel combination of a zener diode and a capacitor connected to output terminals of said bridge rectifier;

(c) first half-cylce means, operated in response to the output of said current transducer, for producing a first voltage which is proportional to said A.C. electrical current flowing through said line over one-half of the period of said A.C. electrical current;

(d) second half-cycle means, operated in response to the output of said current transducer, for producing a second voltage which is proportional to said A.C. current flowing through said line over the remaining half of the period of said A.C. electrical current;

(e) comparison means for comparing said first voltage and at least two of said four D.C. voltage levels, for comparing said second voltage and at least the remaining two of said four D.C. voltage levels, and for producing a train of pulses whose separation in time is a characteristic of said A.C. current flowing through said line; and (f) a microprocessor which has been programed to receive said train of time separated pulses from said comparison means, to count said pulses, to determine time intervals between said pulses, and to calculate an RMS value of the current flowing through said line using said time intervals.

45. Apparatus, comprising:

(a) a clamp-on transformer which is configured to be removably attached and electrically insulated from an A.C. distribution line having current flowing therethrough, said transformer having a magnetic core and a secondary winding with a primary winding of said transformer being formed by said A.C. distribution line;

(b) encoding means, carried by said clamp-on transformer, for comparing a voltage which is derived from said secondary of said transformer and which is a function of the magnitude of said A.C. current to one reference voltage which is derived from said secondary of said transformer, and for producing a coded sequence of light pulses which are characteristic of said A.C. current flowing through said line and which are initiated at the zero-crossing of said A.C. current flowing through said line;

(c) a microprocessor, which is physically remote from said transformer and said encoding means, which has been programmed with a look-up table to compute, from the duration of said light pulses, said electrical current flowing through said line; and (d) means for sending light pulses from said encoding means to said microprocessor and for converting said light pulses to digital values readable by said microprocessor.

46. Apparatus, comprising:

(a) a clamp-on transformer which is configured to be removably attached and electrically insulated from an A.C. distribution line having current flowing therethrough, said transformer having a magnetic core and a secondary winding with a primary winding of said transformer being formed by said A.C. distribution line;

(b) encoding means, comparing a voltage which is derived from said secondary of said transformer and which is a function of the magnitude of said A.C. current to at least four generally constant reference voltages which are derived from said secondary of said transformer, for producing a coded sequence of light pulses which are characteristic of said A.C. current flowing through said line;

(c) microprocessor means, which is physically remote from said transformer and said encoding means, which has been programmed with a look-up table to compute, from the duration of said light pulses, said electrical current flowing through said line; and (d) means for sending light pulses from said encoding means to said microprocessor means and for converting said light pulses to digital values readable by said microprocessor means.

* * * * *